(12) United States Patent
Jung

(10) Patent No.: US 7,592,858 B1
(45) Date of Patent: Sep. 22, 2009

(54) CIRCUIT AND METHOD FOR A GATE CONTROL CIRCUIT WITH REDUCED VOLTAGE STRESS

(75) Inventor: TaeHyung Jung, Santa Clara, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/103,332

(22) Filed: Apr. 15, 2008

(51) Int. Cl.
*G05F 1/10* (2006.01)
(52) U.S. Cl. .................... 327/536; 327/333; 327/390
(58) Field of Classification Search ................ 327/318, 327/319, 333, 390, 534, 535, 536, 537
See application file for complete search history.

(56) References Cited

U.S. PATENT DOCUMENTS

| | | | | |
|---|---|---|---|---|
| 5,594,380 A | * | 1/1997 | Nam | 327/390 |
| 6,356,137 B1 | * | 3/2002 | Roohparvar et al. | 327/390 |
| 6,469,567 B1 | * | 10/2002 | Goyhenetche et al. | 327/390 |
| 6,501,326 B2 | * | 12/2002 | Fujii et al. | 327/536 |
| 7,053,689 B2 | * | 5/2006 | Kim | 327/390 |

* cited by examiner

*Primary Examiner*—Jeffrey S Zweizig
(74) *Attorney, Agent, or Firm*—Slater & Matsil, L.L.P.

(57) ABSTRACT

Circuit and method for a gate control output circuit having reduced voltage stress on the devices is disclosed. In a circuit of MOS transistors for supplying an output to control a transfer gate, the output having a high voltage level that exceeds a supply voltage, first and second clamping circuits are provided. The first clamping circuit ensures a voltage between the gate and the source/drain and drain/source of a PMOS transistor that couples a pumped voltage to the output does not exceed a predetermined voltage. The second clamping circuit ensures that the voltage between the gate of an NMOS transistor and the output which is coupled to the drain/source of the NMOS transistor does not exceed a predetermined amount. The clamping circuits prevent gate stress problems on the transistors by ensuring the voltages between the gates and the source/drain and drain/source terminals do not exceed predetermined voltages.

35 Claims, 6 Drawing Sheets

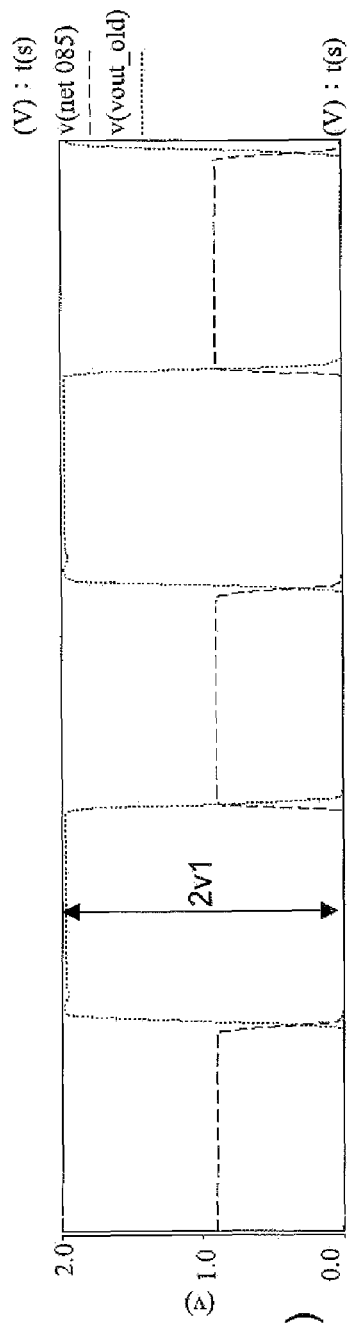
FIGURE 3(a)
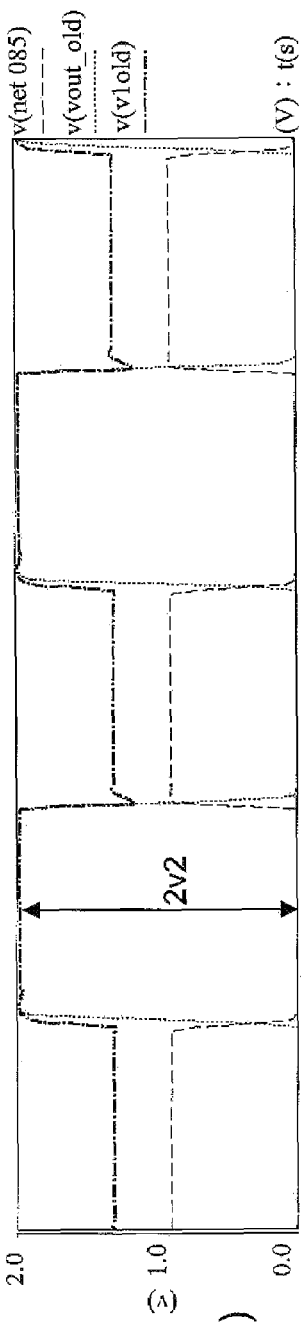
FIGURE 3(b)
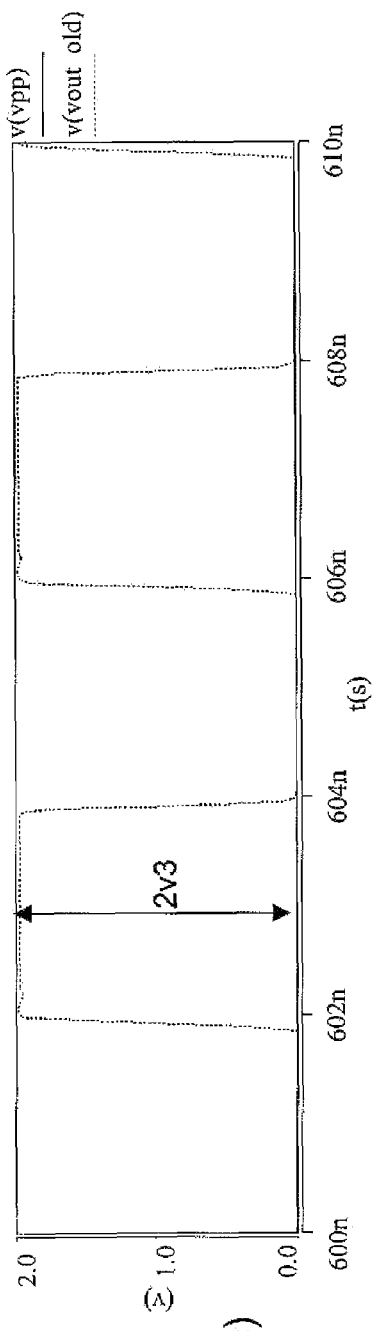
FIGURE 3(c)
FIGURE 3

CIRCUIT AND METHOD FOR A GATE CONTROL CIRCUIT WITH REDUCED VOLTAGE STRESS

TECHNICAL FIELD

The present invention relates to a circuit and method for providing an improved high voltage circuit for use in integrated circuits. Certain circuits within an integrated circuit require higher voltages for operation. Examples of higher voltage circuits include high voltage pump transfer gate control circuits. As semiconductor processes move to smaller feature sizes such as sub-micron processes, requirements increase the difference between the typical voltage used for circuit operations and the higher voltage used for the pump control circuitry. Lower operation supply voltages for circuitry are increasingly prevalent to reduce power consumption, which is particularly essential for battery-powered devices that are becoming increasingly important in consumer applications, including cell phones, PDAs, laptops and notebook computers. Higher voltage circuits are therefore increasingly important. These circuits have voltage differences between gate terminals and drain/source terminals of transistors that can exceed the rated operational voltages, sometimes leading to failure problems due to voltage stress.

BACKGROUND

Highly integrated semiconductor circuits are increasingly important, particularly in producing battery-operated devices such as cell phones, portable computers, laptops, notebook computers, PDAs, wireless email terminals, MP3 audio and video players, portable wireless web browsers and the like, and these sophisticated integrated circuits increasingly include on-board data storage.

As is known in the art, to produce voltages within the integrated circuit that are required for reliable operation, high voltage pump circuits may be used. These circuits are often referred to as "charge pumps." These charge pump circuits produce an output voltage greater than the supply voltage level by periodically charging a capacitor that is then positioned between the output and the supply voltage. When coupled to the output, the charged capacitor adds a DC level to the supply voltage, thereby producing a charge pump voltage output that is greater than the supply voltage. The pump circuit repeatedly charges the capacitor as it discharges to maintain a DC high voltage. Because there are time periods when the pump output is lower than desired (after the pumping capacitor is discharged), one known approach is to provide two charge pumps for supplying a voltage. The two pumps are used interchangeably by coupling the output of one pump to the pumped-up supply voltage node for a period, and then switching to couple the output of the other pump to the supply voltage node. Each pump is clocked with a time varying signal and recharges ("pumps") the respective pumping capacitor between cycles. This approach also requires a pair of control switches, or transfer gates, that periodically couple their respective charge pump output to the pumped-up supply node.

The circuitry used in the transfer gate control circuit typically includes MOS transistors. Because the voltages that these MOS transistors are coupled to exceed the supply voltage, these MOS transistors are susceptible to gate stress reliability problems. Gate stress occurs when the voltage difference between the gate and the source/drain terminals of a MOS transistor exceeds certain rated limits. Gate stress reliability problems may be relieved somewhat by increasing the gate oxide thickness of the transistors used in these circuits to form a so-called "thick oxide" device, which increases the normal voltage ratings the devices can reliably operate with. However, even when additional process steps are used to form such thick oxide devices, reliability of the transistors subjected to the gate stress may remain an issue. As semiconductor processes continue to advance, and device sizes continue to shrink to the sub-micron level and below, these problems become more prevalent.

Thus, there is a continuing need for a transfer gate control voltage circuit with reduced gate stress and methods to produce the MOS transfer gate control circuits for high voltage applications in an integrated circuit. The improved gate control circuits need to be less susceptible to circuit reliability problems associated with gate stress.

SUMMARY OF THE INVENTION

These and other problems are generally solved or circumvented, and technical advantages are generally achieved, by embodiments of the present invention, which provides circuits and methods to improve the operation of sense amplifiers and the voltage references used with the sense amplifiers without requiring dummy cells or added write select signals to enable high speed sense amplifier operations.

In an exemplary embodiment, a gate control circuit for controlling a gate of a transfer gate is provided, comprising an output for controlling the gate; a first transistor for coupling the output to a ground voltage level, having a gate coupled to receive a time varying input signal; a second transistor for coupling the output to a pumped voltage node, having a gate coupled to receive the time varying input signal; a third transistor for coupling the pumped voltage node to an external voltage; a capacitor coupled between an inverter driver and the pumped voltage node for periodically placing a voltage in excess of the supply voltage on the pumped voltage node; a first clamping circuit coupled between the gate of the second transistor and the pumped voltage node for clamping the voltage at the gate of the second transistor and the voltage at the pumped voltage node so that the difference between them never exceeds a first predetermined voltage; and a second clamping circuit coupled between the output and the first node for clamping the voltage at the output to the voltage at the first node so that the difference between them never exceeds a second predetermined voltage.

In another exemplary embodiment, the gate control circuit for controlling a gate of a transfer gate further comprises the transfer gate coupled to transfer an external voltage in excess of a supply voltage to an on-board supply node, responsive to the output.

In another exemplary embodiment, the gate control circuit is provided wherein the transfer gate comprises a MOS transistor having its source to drain current path coupled between the external voltage and the on-board supply node, and having its gate terminal coupled to the output voltage.

In another exemplary embodiment, the gate control circuit is provided wherein the first transistor further comprises an NMOS transistor.

In another exemplary embodiment, the gate control circuit is provided wherein the second clamping circuit further comprises at least one diode-connected transistor.

In another exemplary embodiment, the gate control circuit is provided wherein the first clamping circuit further comprises a diode.

In another exemplary embodiment, the gate control circuit is provided wherein the first clamping circuit further comprises a PMOS transistor.

In another exemplary embodiment, the gate control circuit is provided wherein the second clamping circuit further comprises a diode.

In another exemplary embodiment, the gate control circuit is provided wherein the second clamping circuit further comprises a diode-connected transistor.

In another exemplary embodiment, the gate control circuit is provided wherein the first and second transistors are thick gate oxide transistors.

In another exemplary embodiment, the gate control circuit is provided wherein the capacitor provided is a capacitor connected transistor having its gate forming a first plate of the capacitor and its channel region forming a second plate of the capacitor.

In another exemplary embodiment, the gate control circuit is provided and generates an output with a high level of approximately 2 volts.

In another exemplary embodiment, the gate control circuit is provided wherein the second clamping circuit and the first transistor current path provide a minimum low voltage level at the output.

In another exemplary embodiment, an integrated circuit is provided having an on-board voltage, comprising a charge pump for periodically providing an external voltage that exceeds a supply voltage; a transfer gate coupled to provide the on-board voltage from the external voltage, responsive to a control signal; and a gate control circuit for periodically providing the control signal, the gate control circuit comprising a first transistor for coupling the output of the gate control circuit to a ground voltage level, having a gate coupled to receive a time varying input signal; a second transistor for coupling the output to a pumped voltage node, having a gate coupled to receive the time varying input signal; a third transistor for coupling the pumped voltage node to an external voltage; a capacitor coupled between an inverter driver and the pumped voltage node for periodically placing a voltage in excess of the supply voltage on the pumped voltage node; a first clamping circuit coupled between the gate of the second transistor and the pumped voltage node, for clamping the voltage at the gate of the second transistor and the voltage at the pumped voltage node so that the difference between them never exceeds a first predetermined voltage; and a second clamping circuit coupled between the output and the node, for clamping the voltage at the output to the voltage at the first node so that the difference between the output and the node never exceeds a second predetermined voltage.

In another exemplary embodiment, the integrated circuit is provided and further comprises a second charge pump for periodically supplying a second external voltage that exceeds a supply voltage; a second transfer gate coupled to provide the on-board voltage from the second external voltage, responsive to a second control signal; and a second gate control circuit for periodically providing the second control signal.

In another exemplary embodiment, a circuit for outputting a control gate voltage to a transfer gate is provided, comprising: a first NMOS transistor for coupling the output to a ground voltage level, having a gate coupled to receive a time varying input signal, a source/drain coupled to ground, and a source/drain coupled to a first node; a second PMOS transistor for coupling the output to a pumped voltage node, having a gate coupled to receive the time varying input signal, a source/drain coupled to the output and a source/drain coupled to the pumped voltage node; a third PMOS transistor having its source/drain coupled to an external voltage, its drain/source coupled to the pumped voltage node and its gate terminal coupled to the output voltage; a capacitor coupled between an inverter driver and the pumped voltage node for periodically placing a voltage in excess of the supply voltage on the pumped voltage responsive to a time varying input signal; a first clamping circuit coupled between the gate of the second transistor and the pumped voltage node, for clamping the voltage at the gate of the second transistor and the voltage at the pumped voltage node so that the difference between the gate of the second transistor and the pumped voltage never exceeds a first predetermined voltage; and a second clamping circuit coupled between the output and the first node, for clamping the voltage at the output to the voltage at the first node so that the difference between them never exceeds a second predetermined voltage.

In another exemplary embodiment, the circuit for outputting a control gate voltage is provided wherein the first clamping circuit further comprises a diode-connected transistor.

In another exemplary embodiment, the circuit for outputting a control gate voltage is provided wherein the first clamping circuit further comprises a series of diode-connected PMOS transistors.

In another exemplary embodiment, the circuit for outputting a control gate voltage is provided wherein the second clamping circuit further comprises a diode-connected transistor.

In another exemplary embodiment, the circuit for outputting a control gate voltage is provided wherein the second clamping circuit further comprises an NMOS diode-connected transistor.

In another exemplary method, a method for controlling a high voltage transfer gate is provided, comprising: providing a first transistor between an output for controlling the gate and a ground voltage level, coupling the first transistor gate to a time varying input signal, coupling the source/drain of the first transistor to ground, and coupling a drain/source of the first transistor to a first node; providing a second transistor for coupling the output to a pumped voltage, coupling the gate of the second transistor to receive the time varying input signal, coupling a source/drain of the second transistor to the output and coupling a drain/source of the second transistor to a pumped voltage; providing a third transistor for coupling the pumped voltage node to an external voltage; providing a capacitor coupled between an inverter driver and the pumped voltage node for periodically placing a voltage in excess of the supply voltage on the pumped voltage; coupling a first clamp circuit between the gate of the second transistor and the pumped voltage node, for clamping the voltage at the gate of the second transistor and the voltage at the pumped voltage node so that the difference between the voltage at the gate of the second transistor and the pumped voltage node never exceeds a first predetermined voltage; and coupling a second clamping circuit between the output and first the node, for clamping the voltage at the output to the voltage at the node so that the difference between the output and the node never exceeds a first predetermined voltage.

In another exemplary method, the method for controlling a high voltage transfer gate further comprises: providing the high voltage transfer gate coupled to transfer an external voltage in excess of a supply voltage to an on-board supply node, responsive to the output voltage.

In another exemplary method, the method for controlling a high voltage transfer gate further comprises providing a MOS transistor having its source/drain current path coupled between the external voltage and the on-board supply node, and having its gate terminal coupled to the output voltage.

In another exemplary method, the method for controlling a high voltage transfer gate further comprises providing the first transistor as an NMOS transistor.

In another exemplary method, the method for controlling a high voltage transfer gate further comprises providing the second clamping circuit by providing at least one diode-connected transistor.

In another exemplary method, the method for controlling a high voltage transfer gate further comprises providing the first clamping circuit by providing a diode.

In another exemplary method, the method for controlling a high voltage transfer gate is provided wherein providing the first clamping circuit further comprises providing a PMOS transistor.

In another exemplary method, the method for controlling a high voltage transfer gate is provided wherein providing the second clamping circuit further comprises providing a diode.

In another exemplary method, the method for controlling a high voltage transfer gate is provided wherein providing the second clamping circuit further comprises providing a diode-connected transistor.

In another exemplary method, the method for controlling a high voltage transfer gate is provided wherein providing the first and second transistors further comprises providing thick gate oxide transistors.

In another exemplary method, the method for controlling a high voltage transfer gate is provided wherein providing the capacitor comprises providing a capacitor connected transistor having its gate forming a first plate of the capacitor and its channel region forming a second plate of the capacitor.

In another exemplary method, the method for controlling a high voltage transfer gate further comprises providing an output that has a high level of approximately 2 volts.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates voltage waveforms for the prior art circuit of FIGS. 1 and 2 in operation, wherein FIG. 3(a) illustrates voltages at nodes net085 and vout old, FIG. 3(b) illustrates voltages at nodes net085, vout_old and v1old; and FIG. 3(c) illustrates voltages at the output node vpp and the control gate node vout_old;

FIG. 5 illustrates voltage waveforms for the exemplary embodiment circuit of FIG. 4 in operation, wherein FIG. 5(a) illustrates voltages at nodes net40 and vout, FIG. 5(b) illustrates voltages at nodes v1, vout and net_v2; and FIG. 5(c) illustrates voltages at the output node vpp and the control gate node vout.

The drawings, schematics and diagrams are illustrative, not intended to be limiting but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
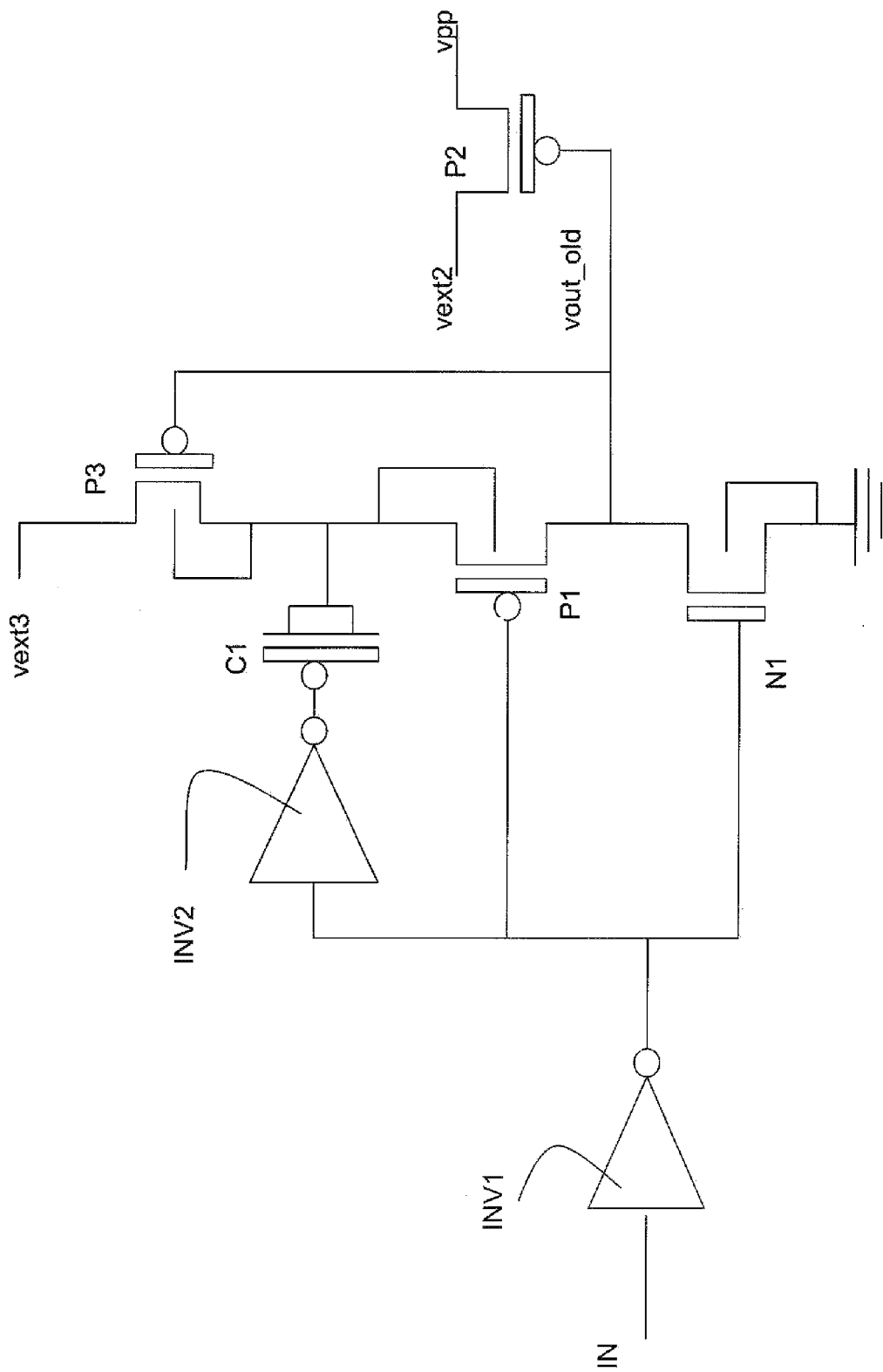
FIG. 1 illustrates a portion of a prior art high voltage supply transfer gate and gate control circuit.

FIG. 1 depicts a prior art gate control circuit. In FIG. 1, the gate control circuit is formed by coupling a capacitor C1 (here, a MOS transistor coupled to use the gate conductor as one plate of a two-terminal capacitor and the source/drain are commonly coupled so that the channel region forms the other capacitor plate; thus the gate oxide of the transistor forms the capacitor dielectric; other alternatives are to use trench, substrate or other capacitors used in integrated circuits as is known in the art) to a time varying signal coupled from the voltage input IN through inverter INV1 and inverter INV2. Note that in FIG. 1, and also in FIGS. 2 and 4, the transistors are shown with a rectangular shape for the gate symbol, this notation indicates that these devices are preferably "thick oxide" devices and may have a gate oxide thickness greater than, and perhaps as much as several times of, the nominal oxide thickness value for a typical logic transistor. In FIG. 1, the transistors P1, P2, P3 and N1, and the transistor that forms capacitor C1 are all shown as thick oxide devices. Thick oxide devices can tolerate higher gate voltages before failing, as compared to typical transistors.

The gate control circuitry operates by coupling the capacitor C1 to a node so that for part of an input cycle, the voltage on the charged capacitor C1 is added to a high voltage, thereby producing a voltage at the output of the gate control circuit that is greater than the normal supply voltage. In this exemplary embodiment the supply voltage may be approximately 1 volt, and the pumped output voltage on the node labeled "vout_old" may be 2 volts. For another portion of the time varying input cycle, the capacitor C1 is charged to replace the lost charge. Thus the voltage at the output vout_old will have a time varying component that rises and falls but will periodically provide a low voltage, and then a high voltage that is greater than the supply voltage. This charge/discharge action is known as "pumping" a capacitor, and gives the pump circuit its name.

Transistor P2 is one of a pair of high voltage transfer gates (for simplicity the other symmetric high voltage transfer gate is not illustrated). In an integrated circuit, a charge pump circuit external to FIG. 1 provides a pumped up voltage labeled vext2. This voltage could be, for example, 2 volts at its peak. Transistor P2 is a PMOS transfer gate that couples the pumped up voltage vext2 to the node labeled vpp when the voltage vext2 is at its high level. In order for vpp to be used as a DC supply voltage by the integrated circuit, vpp must have a DC steady voltage level.

Periodically the voltage vext2 will fall, and the external charge pump circuit coupled to vext2 will have to re-charge its pump capacitor. During those periods, the PMOS transistor gate P2 must be switched off to isolate the node vpp from the pumped voltage vext2. In order to switch off a PMOS device with a high voltage at its input source/drain terminal, the control gate voltage must be increased to be close to that high voltage. As is known to those skilled in the art, to turn off a PMOS transistor such as P2, the gate voltage must be at a level that is within one transistor threshold voltage Vt of the voltage at the source. In FIG. 1, this means that to turn off PMOS transistor gate P2, the control circuit output voltage vout_old must also be increased to be approximately 2 volts. Since the supply voltage available is only 1 volt, a small pump capacitor is used to boost the voltage vout_old during those time periods when P2 needs to be turned off. Capacitor C1, in a typical 45 nanometer semiconductor process with typical transistor sizes, may have a value in the range of femto-Farads to several pico-Farads. If the output loading on C1 is increased, the capacitor can also be increased in size.

Transistor P3 is a PMOS transistor that is controlled by a feedback input from the output node vout_old. Transistor P3 couples the supply voltage vext3 to the capacitor C1 when the output vout_old falls below a threshold, turning on P3. The voltage vext3 can be the normal supply voltage but more preferably is the output of the external charge pump that alternates with vext2 to form vpp. When vext2 is at 2 volts or its high level, vext3 will be less than that high level but will still be greater than the normal positive supply (in this example, around 1 volt). At this time, inverter INV1 is turning on transistor N1, so that transistor P1 is off. Thus vout_old is pulled low and the capacitor C1 is isolated from the output, allowing the capacitor C1 to be charged by voltage vext3. Since the output of INV1 is a high voltage at this time, inverter INV2 inverts this signal and puts a low voltage on the opposing plate of C1 so that it may be charged. While vout_old is low, the voltage at the gate of the transfer gate transistor P2 is also low, so that during this time, voltage vext2 is coupled to the supply voltage node vpp by the transfer gate P2.

Transistor P1 couples the node at the output of the capacitor C1 to the output vout_old when the voltage input IN is a logical "1" or high voltage, due to the inversion of the input signal by inverter INV1. Transistor N1 couples the output vout_old to a Vss or ground voltage reference when the voltage input IN is a logical "0" or low voltage, since inverter INV1 is driving the gate of NMOS transistor N1. By coupling a time varying signal to the voltage input IN, the output voltage vout_old forms a time varying signal that has a high voltage greater than the supply voltage (due to the pumping action of C1) and a low voltage that is close to ground.

When input IN is a logical "1" or high voltage, the inverter INV1 puts out a low voltage, turning off NMOS transistor N1 and turning on PMOS transistor P1. The capacitor C1 which was charged in the prior cycle now sees a positive voltage on the gate plate from inverter INV2, and since C1 is charged already, this adds to the voltage on the capacitor C1 and the voltage on vout_old will exceed the supply voltage and rise to a voltage of approximately 2 volts. This voltage will turn off PMOS transistor P3, and the output voltage vout_old of 2 volts will also turn off the transfer gate transistor P2.

Transistor P2 is a gate controlled transfer gate that produces a voltage vpp from the external charge pump circuit. The voltage vpp is greater than the supply voltage provided to the integrated circuit device by virtue of the coupling of the charge pump capacitors to the vpp supply voltage. By varying the voltage input IN to the control gate circuit of FIG. 1 periodically, and in a manner that is synchronized with the operation of the external charge pump circuits, the voltage on vpp can be maintained at a more or less constant DC level of around 2 volts.

The gate control circuit and the transfer gate P2 illustrated in FIG. 1 are only half of a pair of circuits, which are operated in an alternating manner to couple the pumped voltages vext from a pair of charge pumps to the supply voltage vpp. The external charge pumps are arranged to alternate so that when external voltage vext2 is at its high level, transistor P2 will couple vpp to vext2; at the same time, an external voltage vext3 will be less than its high level, as the pumping capacitor that drives that voltage will be charged during this time. When vext2 is less than its high level, vext3 will be at its high level and will be coupled to vpp using another transfer gate transistor (not shown for simplicity) that is controlled by another transfer gate control circuit that is arranged in the same manner as the circuit in FIG. 1. By timing the time varying inputs to these circuits correctly, the voltage node vpp can be maintained at a steady DC level greater than the supply voltage available on-board the integrated circuit.

In FIG. 1, the inverters INV1 and INV2 are supplied by the normal supply voltage which may be around 1 volt in an exemplary semiconductor process, such as 45 nanometers or 32 nanometers, and the transistors used in implementing those inverters need not be thick oxide devices, although thick oxide devices could also be used.

Those skilled in the art will recognize that MOS transistors are physically structured such that there is no physical difference between the source and drain terminal so those labels are rather arbitrary. Accordingly, the term "source/drain" may be used in this description and in the claims, and if one terminal is labeled "source/drain," the other terminal of the current conduction path of the same transistor may be labeled "drain/source" so that the description and the claims are not unnecessarily limited. Also, one skilled in the art will recognize that although in an exemplary embodiment, a transistor may be described as a PMOS or NMOS type MOS transistor, either type may be used in the alternative. Such alternative arrangements are understood by the inventor, are contemplated as additional embodiments of the embodiments described, and are within the scope of the appended claims. Particular examples presented are not limiting but are for the purpose of providing explanation of the embodiments.

Figure 2:
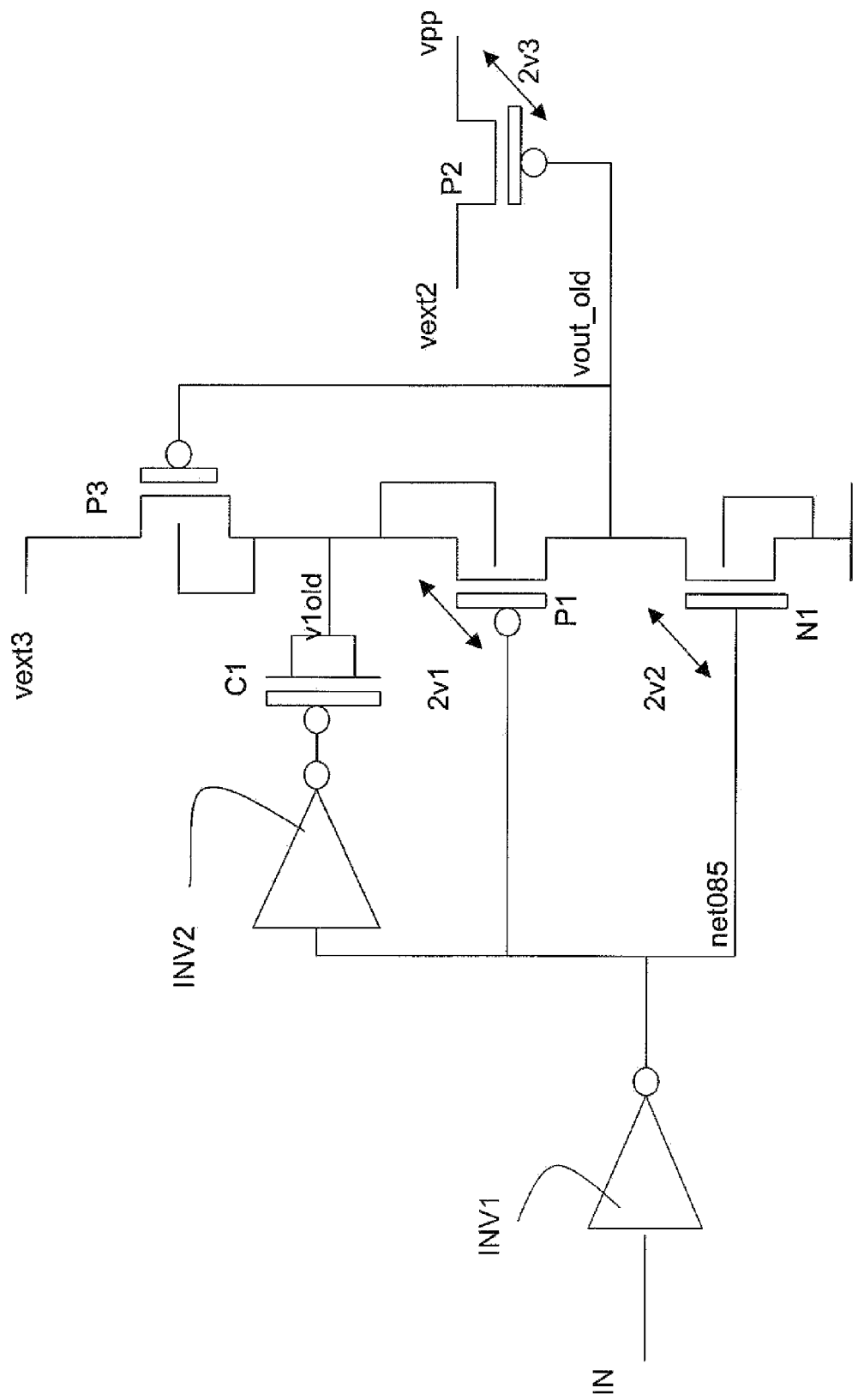
FIG. 2 illustrates the prior art high voltage supply transfer gate and gate control circuit of FIG. 1 with certain potential gate stress voltage points labeled.

FIG. 2 provides the same circuit as in FIG. 1, with certain transistor gate to source/drain voltages labeled to help better explain the gate stresses on the devices. The PMOS transistor P2 is subject to gate stress due to the fact that the voltage at the gate is separated from the voltage on the source. In FIG. 2, the node labeled "net085" is at the gate of NMOS transistor N1. The drain of transistor N1 is coupled to the output node vout_old. The voltage difference between these points is labeled "2v2" in the figure. Transistor P1 has its gate coupled to the same node "net085," which is the output of the inverter INV1. The source/drain of transistor P1 is coupled to the node that is the output of capacitor C1, labeled node "v1old." This voltage difference is labeled "2v1."

In order to better understand the voltage stress problems with the prior art control gate circuit of FIGS. 1 and 2, voltage waveforms for a typical supply voltage and semiconductor process with nominal transistor sizes are presented in FIG. 3. FIG. 3(a) depicts the voltage waveforms that occur at voltage 2v1 in FIG. 2; as can be seen from the figure, when the voltage at node net085 is at a low or zero volts level, the voltage at the output node "vout_old" is at a 2 volt level. The maximum gate to source voltage Vgs for the device N1 is lower than 2 volts, for a typical current semiconductor process of 45 nanometers or 32 nanometers with typical device sizes, the thick oxide device is rated for 1.5 volts +/−10%; thus the level of 2 volts that is placed at voltage 2v1 exceeds the rated voltage for this device.

FIG. 3(b) depicts, in similar fashion, the waveforms that occur around the voltage labeled 2v2, the voltages at the gate, source and drain of PMOS transistor P1. The gate of transistor P1 is again node net085. The source of transistor P1 is coupled to node v1old. The drain of transistor P1 is coupled to node vout_old. As can be seen in FIG. 3(b), when the voltage at the gate terminal of transistor P1 is at a low level of approximately 0 volts, the source and drain are at a level of approximately 2 volts. Thus, again the device P1 is subjected to a gate to source voltage Vgs that exceeds the rated voltage for the device.

FIG. 3(c) depicts the voltages around the PMOS vpp transfer transistor and node 2v3. P2 is a PMOS transistor with the output voltage labeled vout_old on the gate, and voltage vpp on the drain. As can be seen in the waveforms of FIG. 3(c), this voltage difference when vout_old is at a low level is again approximately 2 volts (vpp−vout_old); this is also the gate to source voltage Vgs on the PMOS transistor P2. So for this transfer gate P2, there is voltage stress due to the fact that the gate to source voltage Vgs also exceeds the rating for the device.

Figure 4:
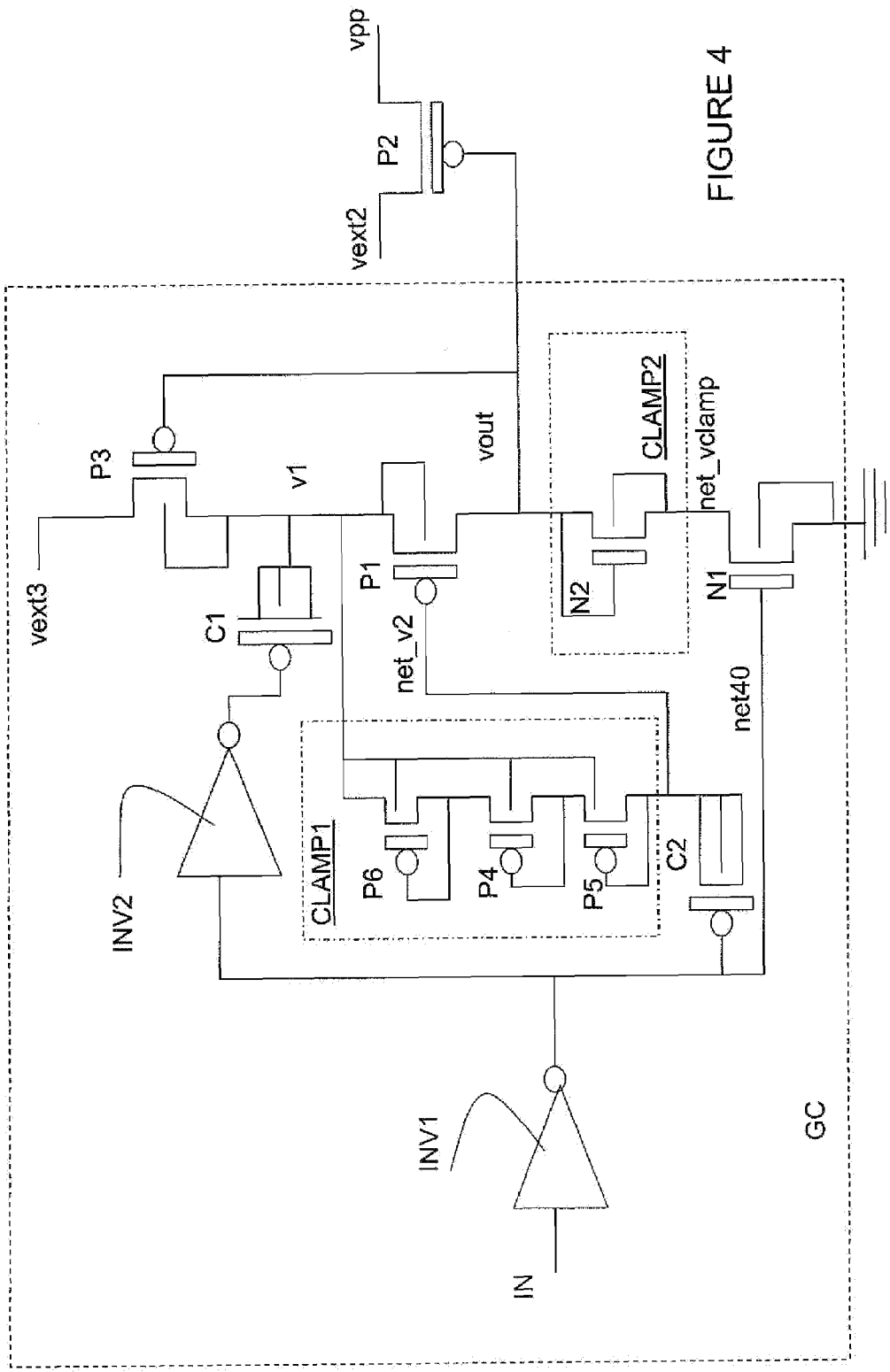
FIG. 4 illustrates an exemplary embodiment of a transfer gate and gate control circuit incorporating the features of the invention.

FIG. 4 illustrates an exemplary embodiment of a transfer gate and transfer gate control circuit incorporating the advantageous features of the invention. In FIG. 4, transistor P2 is again a PMOS transfer gate that couples the pumped voltage vext to the on-board supply voltage vpp, a DC steady voltage designed to be around, for example, 2 volts, and greater than any supply voltage available on the integrated circuit. The transfer gate transistor P2 is controlled by the voltage on its gate terminal, labeled "vout" in FIG. 4. Transistors P2, P1, N1, and capacitor C1, transistor P3 and inverters INV1 and INV2 are coupled together and operate generally as in the prior art circuit illustrated in FIG. 1. The input signal IN is again a time varying signal. The transistors in FIG. 4 are again preferably thick oxide transistors to increase their reliability as indicated by the use of the rectangular shaped gate symbol.

In FIG. 4, a voltage clamp circuit CLAMP2 is shown coupled between the source/drain of transistor N1 and the output voltage vout. CLAMP2 may be, for example, as shown in the exemplary embodiment of FIG. 4, a single diode-connected NMOS transistor N2. Alternatively, a series of such transistors could be used—because the gate and drain are connected together for NMOS transistor N2, transistor N2 will provide a current path between vout and the drain of NMOS transistor N1 so that when the drain to source voltage Vgs across transistor N2 is greater than Vt for transistor N2, the current will flow (transistor N2 will be on) and after that the voltage vout will be clamped to a value of the voltage Vds for transistor N1, plus the threshold voltage drop for diode-connected transistor N2. Vout cannot fall below that minimum voltage so the output of the control circuit, vout, is said to be "clamped" to that voltage. The voltage on the drain of transistor N1 in FIG. 4 is labeled net_clamp, which is the voltage at the source of the clamp transistor N2. Because the clamping circuit CLAMP2 provides a diode drop from vout, with the voltage on the source/drain of N1 no longer rises to 2 volts, but instead is a voltage of around 1.55 volts in an exemplary semiconductor process. Thus, when the gate voltage on transistor N1 is a low voltage, approximately 0 volts, the source/drain voltage at net_clamp is clamped to around 1.55 volts, and the drain to gate voltage Vdg is a maximum of around 1.55 volts, this is within the rated operating range for NMOS transistor N1 (again a thick oxide device). Note that although one diode-connected transistor N2 is used in the CLAMP2 circuit in the particular example depicted in FIG. 4, the clamping circuit could be formed of diodes instead of diode-connected transistors, and more than one device can be used, if needed, to tailor the voltage drop across the clamp to a different voltage. The purpose of the clamp is to reduce the voltage stress on the NMOS transistor N1 by lowering the maximum voltage on the drain terminal of N1. Further, as described in more detail below, CLAMP2 operates to advantageously prevent the node vout from dropping too far.

In the exemplary embodiment of the implementation depicted in FIG. 4, a second clamping circuit is provided. This circuit, CLAMP1, is shown having a series of diode elements coupled together. In this particular example three PMOS thick oxide transistors P4, P5 and P6 are used. However, more diodes (here diode-connected transistors) or fewer could be used to tailor the voltage drop across the clamping circuit CLAMP1 as needed. Although it is common practice to use transistors having the gate and drain terminals coupled together to form diode-connected transistors, as shown, actual diodes could be used as an alternative embodiment.

CLAMP1 operates to control the voltage drain to gate voltage Vdg for the PMOS transistor P1. The voltage v1 on the source/drain terminal is clamped to the voltage net_v2 on the gate terminal by the three diode coupled PMOS transistors P6, P5 and P4. A second pumping capacitor C2 is also provided. The voltage on the gate of P1 cannot be more than three diode drops lower than the voltage on the source/drain of P1, because as the voltage on the gate (on the net labeled net_v2 in FIG. 4) falls, the clamping diodes will become forward biased and connect the two nodes together, thereby clamping the drain to gate voltage Vdg to around 1 volt (3 threshold voltages 3Vt). This clamping action reduces the gate stress on transistor P1 in FIG. 4 over the gate stress on transistor P1 in the prior art circuit of FIG. 1, which allowed the drain to gate voltage of P1 to be as much as 2 volts Vdg, which is more than the rated operating range for the transistor P1.

In FIG. 4, in addition to the clamping circuits CLAMP1 and CLAMP2, a second pump capacitor C2 is shown. This capacitor will provide a boosted voltage on the gate of transistor P1 when it is desired to turn P1 off. This is advantageous because it prevents transistor P1 from accidentally turning ON if the voltage at the source/drain at node V1 is as high as 2 volts, because the pump capacitor C2 increases the voltage on the net_v2 to approximately 2 volts.

The addition of the circuit CLAMP2 in FIG. 4 has further benefits over the prior art circuit. The transfer gate P2, which provides the output voltage vpp in response to the control vout on the gate terminal of P2, also experiences gate voltage stress when the prior art approach is used. In FIG. 4, the exemplary embodiment illustrated also reduces the stress on the transistor P1. Because the output voltage vout cannot fall below a diode drop above ground, the lowest voltage on the gate terminal of P2 is now higher than before, about 0.45 volts in an exemplary semiconductor process using typically-sized transistors. The voltage vpp is around 2 volts, which is on the drain of the transistor P2, so the voltage from drain to gate Vdg is now around 1.55 volts, again this voltage is within the rated operating range for the PMOS transistor P2 (again a thick oxide device).

In FIG. 4, the transistors P1, N1 and P3, the clamping circuits CLAMP1 and CLAMP2, the inverters INV1 and INV2 and the pump capacitors C1 and C2 together are shown as a gate control circuit GC. Two of these circuits may be used with two transfer gates (such as P2) to alternately couple one of a pair of charge pump output voltages such as vext2 to an on-board voltage such as vpp. The input signals, which are time varying, can be selected so that the circuits operate in alternating cycles to provide a steady voltage to the on-board supply node.

Figure 5:
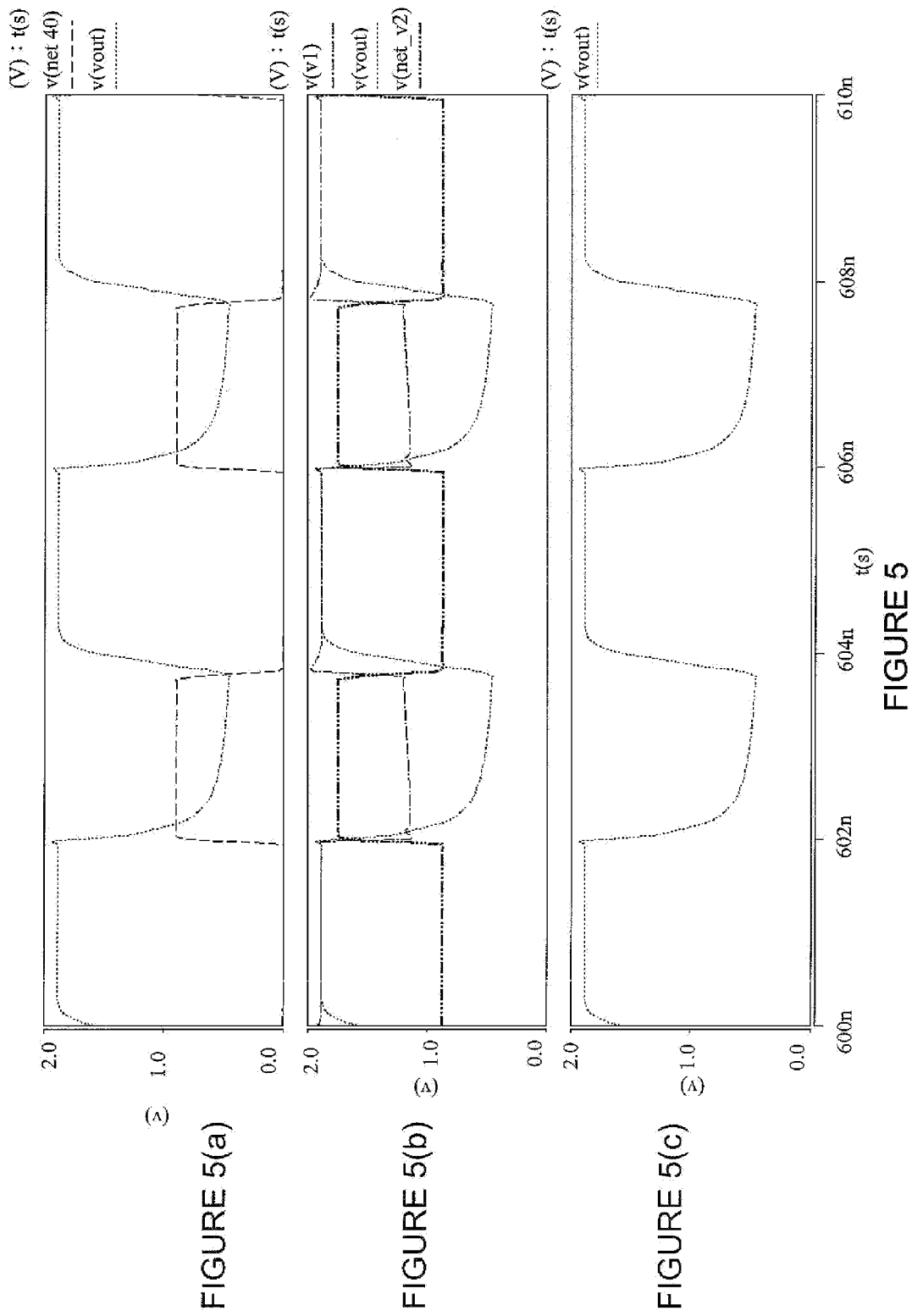

FIG. 5 depicts voltage waveforms, further illustrating the advantageous operation of the embodiment depicted in FIG. 4. In FIG. 5, the voltage waveforms illustrated in FIG. 5(a) depict the nodes around transistor N1 of FIG. 4. In FIG. 5(a) the voltage on the gate terminal of transistor N1 is waveform "net_40." The voltage on the drain terminal of transistor N1 is the waveform labeled "vout." These waveforms correspond to the voltages observed over time at the same labeled nodes in the exemplary embodiment implementation illustrated in FIG. 4.

In FIG. 5(a) at time 605.9 nanoseconds, (the trace starts at time 600 ns) the maximum voltage value for the net vout is 1.5425 volts. The value at the gate (on net_40) is about 0 volts at that time, thus the voltage Vgd is around 1.55 volts. When compared to the waveforms of FIG. 3(a) illustrating the gate stress on transistor N1 of FIGS. 1 and 2, the prior art circuit, it can be seen that the voltage Vgd for the prior art circuit is around 2.0 volts. Thus the use of the illustrated embodiment circuit advantageously reduces the gate stress voltage by about 25%. More significantly, the maximum gate to source voltage is reduced to a voltage within the rated operating range for the device, greatly reducing the likelihood of a failure due to gate stress effects.

In FIG. 5(b) waveforms are shown for the nodes around the PMOS transistor P1. The gate of transistor P1 in the exemplary implementation illustrated in FIG. 4 is coupled to a node net_v2. Node v1 is coupled to the source/drain of transistor P1. At time 604.8 ns (the traces start at time 600 ns at the origin of FIG. 5(b)), net_v2 is at voltage 0.86 volts, while the drain voltage at that time is around 1.88 volts, and the voltage Vdg is therefore around 1.02 volts. Comparing this waveform to the voltage 2v2 in FIG. 3(b), it can be seen that the use of the illustrated embodiment has improved the stress voltage over the prior art from 2.0 volts, to 1.02 volts, for the transistor P1. More importantly, this voltage is now well within the rated operating voltages for the device P1.

FIG. 5(c) illustrates the voltage waveforms for the voltages on the gate and the drain/source output terminal for the transfer gate P2. In FIG. 5(c) the voltage on the gate of transistor P1, vout, is shown at its lowest point at time 607.76 ns (the traces start at time 600 ns at the origin of FIG. 5(c)), at voltage 0.45351 volts. At that same time the output voltage vpp, which is a DC steady state supply voltage, is around 2.0 volts, thus the voltage Vdg is around 1.55 volts. Again, this is significantly lower than the corresponding voltage difference illustrated in FIG. 3(c) for the transfer gate device illustrated in FIG. 2. In that prior art waveform, the voltage 2v3 is 2.0 volts greater than the rated operating range for the device. The use of the illustrated embodiment circuit advantageously reduces the stress on the transfer gate transistor P2 over the prior art circuit.

Figure 6:
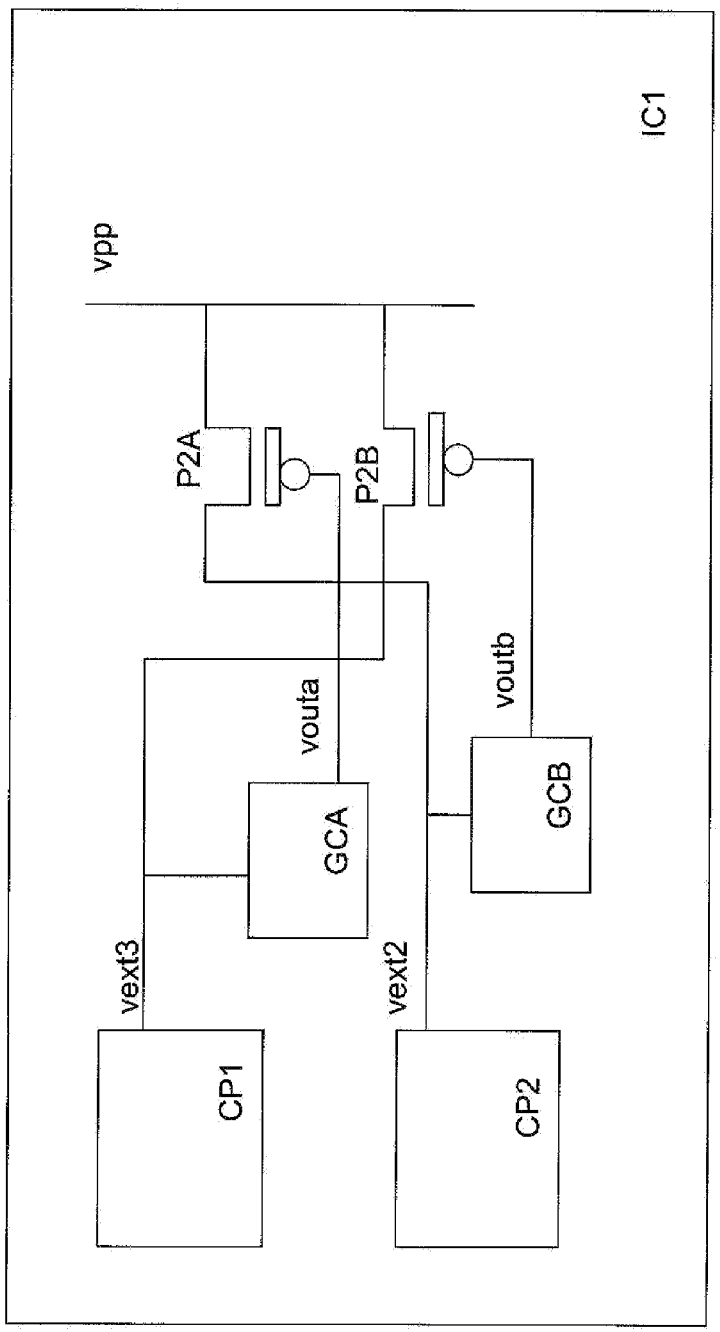
FIG. 6 illustrates a simplified block diagram of an integrated circuit with an on-board voltage generator using two charge pumps, two transfer gates and two of the gate control circuits of FIG. 4 incorporating the features of the invention.

FIG. 6 illustrates, in a simple block diagram, an integrated circuit IC that has an on-board voltage vpp provided from a pair of transfer gate devices P2A and P2B. Each transfer gate receives an external high voltage (labeled vext2, vext3) from a respective charge pump circuit (labeled CP1 for vext3 and CP2 for vext2.) Each transfer gate has, coupled to its gate terminal, a control gate circuit GCA and GCB that supplies output voltages vouta and voutb. Each of the gate control circuits is an instance of the gate control circuit of FIG. 4.

In operation, the charge pumps CP1 and CP2 provide external high voltages vext3, and vext2, by pumping a capacitor with a normal supply voltage of around 1 volt using a time varying signal. The outputs vext2 and vext3 will be at around 2 volts maximum, and as described above, will periodically fall below that voltage.

When vext3 is at a high voltage, the output voutb from gate control circuit GCB will be at a low voltage, causing the PMOS transistor P2B, the transfer gate, to couple vext3 to the on-board voltage node vpp. During this time, vext2 is lower than the 2 volt maximum and the charge pump CP2 must recharge its pump capacitor. When vext2 is at the maximum high of around 2 volts, and after vext3 has been used for a time, the gate control circuit GCA will output a low voltage on the output vouta, causing PMOS transistor P2A, the second transfer gate, to couple vext2 to the on-board voltage node vpp. At approximately the same time, gate control circuit GCB will raise output voltage voutb to a high voltage of approximately 2 volts, causing transfer gate transistor P2B to shut off, therefore isolating vext3 from the node vpp. The two transfer gates will be turned on and off by the two gate control circuits in a synchronously alternating manner, with the pumping operations of the two charge pumps CP1 and CP2 to provide a steady state voltage at on-board node vpp. The integrated circuit IC1 may be formed using typical semiconductor processes including using silicon substrates, SOI, GaAs, for example as a starting material, and using doping, polysilicon and oxide deposition, etch and epitaxial operations, metallization and CMP to complete the transistor devices. The integrated circuit IC1 may include many other types of circuits including some circuits that use the node vpp as a high supply voltage.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus comprising:
   an output for controlling a gate;
   a first transistor for coupling the output to a ground voltage level, having a gate coupled to receive a time varying input signal, a source/drain coupled to ground, and a drain/source coupled to a first node;
   a second transistor for coupling the output to a pumped voltage transistor, having a gate coupled to receive the time varying input signal, a source/drain coupled to the output and a drain/source coupled to a pumped voltage node;
   a third transistor for coupling the pumped voltage node to an external voltage;
   a capacitor coupled between an inverter driver and the pumped voltage node for periodically placing a voltage in excess of the external voltage on the pumped voltage node;

a first clamping circuit coupled between the gate of the second transistor and the pumped voltage node, for clamping the voltage at the gate of the second transistor and the voltage at the pumped voltage node so that the voltage difference between them never exceeds a first predetermined voltage; and a second clamping circuit coupled between the output and the first node, for clamping the voltage at the output to the voltage at the first node so that the voltage difference between them never exceeds a second predetermined voltage.

2. The apparatus of claim 1, and further comprising a transfer gate coupled to transfer a high external voltage in excess of a supply voltage to an on-board supply node, responsive to the output.

3. The apparatus of claim 2, wherein the transfer gate comprises a MOS transistor having its source to drain current path coupled between the high external voltage and the on-board supply node and having its gate terminal coupled to the output.

4. The apparatus of claim 1, wherein the first transistor further comprises an NMOS transistor.

5. The apparatus of claim 1, wherein the second clamping circuit further comprises at least one diode-connected transistor.

6. The apparatus of claim 1, wherein the first clamping circuit further comprises a diode.

7. The apparatus of claim 6, wherein the first clamping circuit further comprises a PMOS transistor.

8. The apparatus of claim 1, wherein the second clamping circuit further comprises a diode.

9. The apparatus of claim 8, wherein the second clamping circuit further comprises a diode-connected transistor.

10. The apparatus of claim 1, wherein at least the first and second transistors are thick gate oxide transistors.

11. The apparatus of claim 1, wherein the capacitor is a capacitor connected transistor having a gate forming a first plate of the capacitor and a channel region forming a second plate of the capacitor.

12. The apparatus of claim 1, wherein the output has a high level of approximately 2 volts.

13. The apparatus of claim 1, wherein the second clamping circuit and the first transistor comprise a current path providing a minimum low voltage level at the output.

14. An integrated circuit having an on-board voltage, comprising:

a charge pump for periodically providing a high external voltage that exceeds a supply voltage;

a transfer gate coupled to provide the on-board voltage from the high external voltage, responsive to a control signal; and a gate control circuit for providing the control signa, comprising:

a first transistor for coupling the control signal to a ground voltage level, having a gate coupled to receive a time varying input signal, a source/drain coupled to ground, and a drain/source coupled to a first node;

a second transistor for coupling the control signal to a pumped voltage node, having a gate coupled to receive the time varying input signal, a source/drain coupled to the control signal and a drain/source coupled to the pumped voltage node;

a third transistor for coupling the pumped voltage node to an external voltage;

a capacitor coupled between an inverter driver and the pumped voltage node for periodically placing a voltage in excess of the supply voltage on the pumped voltage node;

a first clamping circuit coupled between the gate of the second transistor and the pumped voltage node, for clamping the voltage at the gate of the second transistor and the voltage at the pumped voltage node so that the voltage difference between them never exceeds a first predetermined voltage; and a second clamping circuit coupled between the control signal and the first node, for clamping the voltage at the output to the voltage at the first node so that the voltage difference between them never exceeds a second predetermined voltage.

15. The integrated circuit of claim 14, and further comprising a second charge pump for periodically supplying a second high external voltage that exceeds a supply voltage;

a second transfer gate coupled to provide the on-board voltage from the second high external voltage, responsive to a second control signal; and a second gate control circuit for providing the second control signal comprising:

a fourth transistor for coupling the second control signal to a ground voltage level, having a gate coupled to receive a time varying input signal, a source/drain coupled to ground, and a drain/source coupled to a first node;

a fifth transistor for coupling the output to a pumped voltage node, having a gate coupled to receive the time varying input signal, a source/drain coupled to the output and a drain/source coupled to the pumped voltage node;

a sixth transistor for coupling the pumped voltage node to an external voltage;

a capacitor coupled between an inverter driver and the pumped voltage node for periodically placing a voltage in excess of the supply voltage on the pumped voltage node;

a third clamping circuit coupled between the gate of the fifth transistor and the pumped voltage node, for clamping the voltage at the gate of the fifth transistor and the voltage at the pumped voltage node so that the voltage difference between them never exceeds a third predetermined voltage; and a fourth clamping circuit coupled between the second control signal and the first node, for clamping the voltage at the second control signal to the voltage at the first node so that the difference between the output and the first node never exceeds a fourth predetermined voltage.

16. A circuit for outputting a control gate voltage to a transfer gate, the control gate voltage having a high voltage level in excess of a supply voltage, comprising:

a first NMOS transistor for coupling the control gate voltage to a ground voltage level, having a gate coupled to receive a time varying input signal, a source/drain coupled to ground, and a source/drain coupled to a first node;

a second PMOS transistor for coupling the control gate voltage to a pumped voltage node, having a gate coupled to receive the time varying input signal, a source/drain coupled to the output and a source/drain coupled to the pumped voltage node;

a third PMOS transistor having its source/drain coupled to an external voltage, its drain/source coupled to the pumped voltage node and its gate terminal coupled to the output voltage;

a capacitor coupled between an inverter driver and the pumped voltage node for periodically placing a voltage in excess of the supply voltage on the pumped voltage node responsive to a time varying input signal;

a first clamping circuit coupled between the gate of the second PMOS transistor and the pumped voltage node, for clamping the voltage at the gate of the second PMOS transistor and the voltage at the pumped voltage node so that the voltage difference between them never exceeds a first predetermined voltage; and a second clamping circuit coupled between the control gate voltage and the first node, for clamping the control gate voltage to the voltage at the first node so that the voltage difference between them never exceeds a second predetermined voltage.

17. The circuit of claim 16, wherein the first clamping circuit further comprises a diode-connected transistor.

18. The circuit of claim 17, wherein the first clamping circuit further comprises a series of diode-connected PMOS transistors.

19. The circuit of claim 16, wherein the second clamping circuit further comprises a diode-connected transistor.

20. The circuit of claim 19, wherein the second clamping circuit further comprises an NMOS diode-connected transistor.

21. A method for controlling a high voltage transfer gate, comprising:

providing a first transistor between an output for controlling the gate and a ground voltage level, coupling a first transistor gate to a time varying input signal, coupling a source/drain of the first transistor coupled to ground, and coupling a drain/source of the first transistor to a first node;

providing a second transistor for coupling the output to a pumped voltage node, coupling a gate of the second transistor to receive the time varying input signal, coupling a source/drain of the second transistor to the output and coupling a drain/source of the second transistor to the pumped voltage node;

providing a third transistor for coupling the pumped voltage node to an external voltage;

providing a capacitor coupled between an inverter driver and the pumped voltage node for periodically placing a voltage in excess of the supply voltage on the pumped voltage node;

coupling a first clamp circuit between the gate of the second transistor and the pumped voltage node, for clamping the voltage at the gate of the second transistor and the voltage at the pumped voltage node so that the voltage difference between them never exceeds a first predetermined voltage; and coupling a second clamping circuit between the output and the first node, for clamping the voltage at the output to the voltage at the node so that the voltage difference between them never exceeds a second predetermined voltage.

22. The method of claim 21, and further comprising:

providing the high voltage transfer gate coupled to transfer a high external voltage in excess of a supply voltage to an on-board supply node, responsive to the output voltage.

23. The method of claim 22, wherein providing the high voltage transfer gate further comprises providing a MOS transistor having its source/drain current path coupled between the high external voltage and the on-board supply node and having its gate terminal coupled to the output voltage.

24. The method of claim 21, wherein providing the first transistor further comprises providing an NMOS transistor.

25. The method of claim 21, wherein coupling the second clamping circuit further comprises providing at least one diode-connected transistor.

26. The method of claim 21, wherein coupling the first clamping circuit further comprises providing a diode.

27. The method of claim 26, wherein coupling the first clamping circuit further comprises providing a PMOS transistor.

28. The method of claim 21, wherein coupling the second clamping circuit further comprises providing a diode.

29. The method of claim 28, wherein coupling the second clamping circuit further comprises providing a diode-connected transistor.

30. The method of claim 21, wherein coupling at least the first and second transistors further comprises providing thick gate oxide transistors.

31. The method of claim 21, wherein providing the capacitor comprises providing a capacitor-connected transistor having its gate forming a first plate of the capacitor and its channel region forming a second plate of the capacitor.

32. The method of claim 21, wherein coupling the output to the pumped voltage node further comprises providing an output that has a high level of approximately 2 volts.

33. A method for generating an on-board voltage on an integrated circuit, comprising:

providing a charge pump coupled for periodically providing a high external voltage that exceeds a supply voltage;

coupling a transfer gate to provide the on-board voltage from the high external voltage, responsive to a control signal; and providing a gate control circuit for providing the control signal, further comprising:

providing a first transistor for coupling the control signal to a ground voltage level, coupling a gate of the first transistor to receive a time varying input signal, coupling a source/drain of the first transistor to ground, and coupling a drain/source of the first transistor to a first node;

providing a second transistor for coupling the control signal to a pumped voltage node, coupling a gate of the second transistor to receive the time varying input signal, coupling the source/drain of the second transistor to the control signal and coupling a drain/source of the second transistor to the pumped voltage node;

providing a third transistor for coupling the pumped voltage node to an external voltage;

providing a capacitor coupled between an inverter driver and the pumped voltage node for periodically placing a voltage in excess of the supply voltage on the pumped voltage node;

coupling a first clamping circuit between the gate of the second transistor and the pumped voltage node, for clamping the voltage at the gate of the second transistor and the voltage at the pumped voltage node so that the voltage difference between them never exceeds a first predetermined voltage; and coupling a second clamping circuit between the control signal and the first node, for clamping the voltage of the control signal to the voltage at the first node so that the voltage difference between them never exceeds a second predetermined voltage.

34. The method of claim 33 and further comprising:

providing a second charge pump for periodically supplying a second external voltage that exceeds a supply voltage;

providing a second transfer gate coupled to provide the on-board voltage from the second external voltage, responsive to a second control signal; and providing a second gate control circuit for periodically providing the second control signal, further comprising:

providing a fourth transistor for coupling the second control signal to a ground voltage level, coupling a gate of the fourth transistor to receive a second time varying input signal, coupling a source/drain of the fourth transistor to ground, and coupling a drain/source of the fourth transistor to a first node;

providing a fifth transistor for coupling the second control signal to a pumped voltage node, coupling the gate of the fifth transistor to receive the second time varying input signal, coupling the source/drain of the fifth transistor to the second control signal and coupling a drain/source of the fifth transistor to the pumped voltage node;

providing a sixth transistor for coupling the pumped voltage node to an external voltage;

providing a second capacitor coupled between an inverter driver and the pumped voltage node for periodically placing a voltage in excess of the supply voltage on the pumped voltage node;

coupling a third clamping circuit between the gate of the fifth transistor and the pumped voltage node, for clamping the voltage at the gate of the fifth transistor and the voltage at the pumped voltage node so that the voltage difference between them never exceeds a third predetermined voltage; and coupling a fourth clamping circuit between the second control signal and the first node, for clamping the voltage of the second control signal to the voltage at the first node so that the difference between them never exceeds a fourth predetermined voltage.

35. A method for generating a control gate output in excess of a supply voltage, comprising:

coupling a first NMOS transistor between the control gate output and a ground voltage level, coupling a gate of the first NMOS transistor to receive a time varying input signal, coupling a source/drain of a first transistor ground, and coupling a drain/source of the first transistor to a first node;

coupling a second PMOS transistor between the control gate output and a pumped voltage node, coupling a gate of the second PMOS transistor to receive the time varying input signal, coupling the source/drain of the second PMOS transistor to the output and coupling the drain/source to the pumped voltage node;

coupling a third PMOS transistor between the pumped voltage node and an external voltage, coupling the drain/source of the third PMOS transistor to the pumped voltage node and coupling the gate terminal of the third PMOS transistor to the control gate output;

coupling a capacitor between an inverter driver and the pumped voltage node for periodically placing a voltage in excess of the supply voltage on the pumped voltage node, responsive to the time varying input signal;

coupling a first clamping circuit between the gate of the second PMOS transistor and the pumped voltage node, for clamping the voltage at the gate of the second PMOS transistor and the voltage at the pumped voltage node so that the voltage difference between them never exceeds a first predetermined voltage; and coupling a second clamping circuit between the output and the first node, for clamping the voltage at the output to the voltage at the first node so that the voltage difference between them never exceeds a second predetermined voltage.

* * * * *

UNITED STATES PATENT AND TRADEMARK OFFICE
CERTIFICATE OF CORRECTION

PATENT NO. : 7,592,858 B1
APPLICATION NO. : 12/103332
DATED : September 22, 2009
INVENTOR(S) : Jung It is certified that error appears in the above-identified patent and that said Letters Patent is hereby corrected as shown below:

In Col. 11, line 16, delete "net_40" and insert --net net_40--.
In Col. 13, line 54, delete "signa" and insert --signal--.

Signed and Sealed this

First Day of December, 2009

David J. Kappos
*Director of the United States Patent and Trademark Office*